United States Patent [19]

Laude et al.

[11] Patent Number: 4,701,643
[45] Date of Patent: Oct. 20, 1987

[54] FET GATE CURRENT LIMITER CIRCUITS

[75] Inventors: David P. Laude, Colorado Springs; Glenn E. Noufer, Chipita Park, both of Colo.

[73] Assignee: Ford Microelectronics, Inc., Colorado Springs, Colo.

[21] Appl. No.: 843,166

[22] Filed: Mar. 24, 1986

[51] Int. Cl.$^4$ .................. H03K 17/10; H03K 17/284; H03K 19/003; H03K 19/094

[52] U.S. Cl. .................................... 307/450; 307/446; 307/544; 307/559; 307/568

[58] Field of Search ............... 307/443, 448, 446, 450, 307/475, 542, 544, 549, 550, 555, 557–560, 564, 568, 491

[56] References Cited

U.S. PATENT DOCUMENTS

| | | | |
|---|---|---|---|
| 4,300,064 | 11/1981 | Eden | 307/446 |
| 4,393,315 | 7/1983 | Stickel et al. | 307/475 X |
| 4,405,870 | 9/1983 | Eden | 307/446 |
| 4,418,292 | 11/1983 | Cserhalmi et al. | 307/446 |
| 4,471,238 | 9/1984 | Hickling | 307/450 |
| 4,488,064 | 12/1984 | Vance | 307/475 X |

FOREIGN PATENT DOCUMENTS

| | | | |
|---|---|---|---|
| 0041415 | 12/1981 | European Pat. Off. | 307/450 |
| 0110701 | 6/1984 | European Pat. Off. | 307/475 |
| 0170134 | 2/1986 | European Pat. Off. | 307/446 |
| 2230125 | 12/1974 | France | 307/448 |
| 231920 | 2/1984 | Japan | 307/446 |

OTHER PUBLICATIONS

Nuzillat et al, "Low Pinch-Off Voltage FET Logic (LPFL): L.S.I. Oriented Logic Approach Using Quasi-normally Off GaAs MESFETs"; IEE Proc., vol. 127, Pt. I, No. 5, pp. 287–296.

Hartgring, C. D. et al., "Silicon MESFET Digital Circuit Techniques", IEEE Journal of Solid-State Circuits, vol. SC-16, No. 5, (10–81), pp. 578–584.

Lehovec, K., et al., "Analysis of GaAs FET's for Integrated Logic", IEEE Transactions on Electron Devices, vol. ED-27, No. 6 (6–80), pp. 1074–1091.

*Primary Examiner*—Stanley D. Miller
*Assistant Examiner*—David R. Bertelson

[57] ABSTRACT

A GaAs logic circuit uses a first FET to control the application of a logic signal from an input to an output. The first FET inherently has parasitic gate-to-source and gate-to-drain diodes. A control signal applied to the gate of the first FET controls the application of the logic signal to the output through the first FET. For a first FET that is an enhancement mode GaAs device, the gate current tends to forward bias such diodes under all operating conditions and tends to significantly increase the gate current. For a first FET that is a depletion-mode device, adverse operating temperatures can cause such tendency to forward bias these diodes and other circuit diodes. A limiter FET connected to the gate to limit the gate current and thus limits the forward biasing of the parasitic and circuit diodes. This reduces the effect on the gate current of variations in the power supplies to the FET, process variations and operating temperature variations. Limiting the gate current also limits the voltage drop resulting from the source resistance of the first FET, maintaining the voltage swing of the logic signal at the output at desired levels. If the gate current were not limited, the resulting greater forward bias of those diodes would cause an increase in the current drain from a voltage supply that biases the first FET. The unlimited forward bias would also result in a greater voltage drop from drain-to-source across the first FET, reducing the $V_{OL}$ at the output and resulting in lower noise margin.

8 Claims, 9 Drawing Figures

Fig_1
PRIOR ART

Fig_2
PRIOR ART

Fig_3

Fig_4

Fig_5A

Fig_5B

Fig_5C

Fig_5D

Fig_5E

FET GATE CURRENT LIMITER CIRCUITS

BACKGROUND OF THE INVENTION

1. Field of the Invention

The present invention relates to the field of solid state electronics and more particularly to the field of solid state electronic logic circuits.

2. Description of the Prior Art

In designing logic circuits, attempts have been made to obtain the benefits of Gallium Arsenide (GaAs) technology while minimizing the disadvantages. In particular, GaAs provides considerably greater field effect transistor (FET) channel electron mobility than conventional semiconductors. Further, GaAs wafers exhibit very low parasitic capacitance. These factors allow fabrication of much faster transistors in GaAs than silicon.

Since GaAs depletion-mode metal-semi conductor FET (MESFET) technology has the longest manufacturing history of the GaAs technologies, the depletion-mode technology presently offers more promise for easy, cost-effective production of commercial GaAs logic circuits. In GaAs logic circuit applications, MESFET threshold voltages may range from $+0.4$ to $-2.0$ V and gate-source voltages may be as low as $-3.0$ V. As the gate-source supply voltage becomes more negative, power dissipation increases. As threshold voltages approach 0.0 V, less negative (lower power) gate-source supply voltages can be used, reducing power dissipation. Reduced power dissipation becomes important in designing GaAs logic gate arrays of appreciable size (eg. larger than 80 gates). In depletion-mode GaAs FET logic gate array designs, where power dissipation may be several milliwatts per gate, the ability to use low power supply voltages is very important. However, since manufacturing tolerances become critical as threshold voltages approach 0.0 V, a common compromise for the nominal low voltage supply is $-2$ V. While this eases manufacturing tolerances, which are of critical concern to cost-effective commercial manufacture of logic gate arrays, the low nominal power supply voltage limits the nominal voltage swing of the output of the circuit. Although this reduced nominal output voltage swing increases the switching speed of the output of the circuit, it substantially reduces the noise margin of the next logic circuit. As a result, the reduced nominal output voltage swing increases the susceptibility of the next logic circuit to triggering in response to unwanted noise in the connecting lines.

Although depletion-mode FET manufacturing technology has the longest manufacturing history of the GaAs technologies, depletion-mode FETs made from present day GaAs technology still have relatively poor matching qualities, which increases the difficulty of designing cost-effective logic gate arrays using large numbers of gates. Device matching problems and process limitations are even greater problems in enhancement-mode FET circuit production. In particular, due to limitations in the production of both of these technologies, from device to device on a single logic gate array chip, the logic threshold voltage and output voltage may vary considerably. In a gate array, this is a substantial problem since any one input gate of a given logic circuit can be connected to an output gate of any other logic circuit. These variations in input logic threshold voltage and output voltage can decrease noise margins and interfere with the intended system operation.

Even when such depletion-mode and enhancement-mode circuits are designed to be insensitive to such variations in input logic threshold voltages and output voltage swing, under certain operating conditions the output voltage swing will be reduced due to forward biasing of an FET. In particular, the source resistance inherent in the FET produces an undesired voltage drop in response to increased gate current resulting from forward biasing of the FET. This adds to the drain-to-source voltage drop across the FET, which reduces the output voltage swing when the FET is used in an inverter. Also, as the operating temperature of the circuit increases, the voltage drop across circuit diodes decreases. This applies both to diodes connected to the FET and to the gate-source junction diode of an inverter FET and results in increased gate current. The increased gate current adds to the above-described reduction of output voltage swing due to an increase in the source resistance of the FET as the operating temperature increases.

Figure 1:
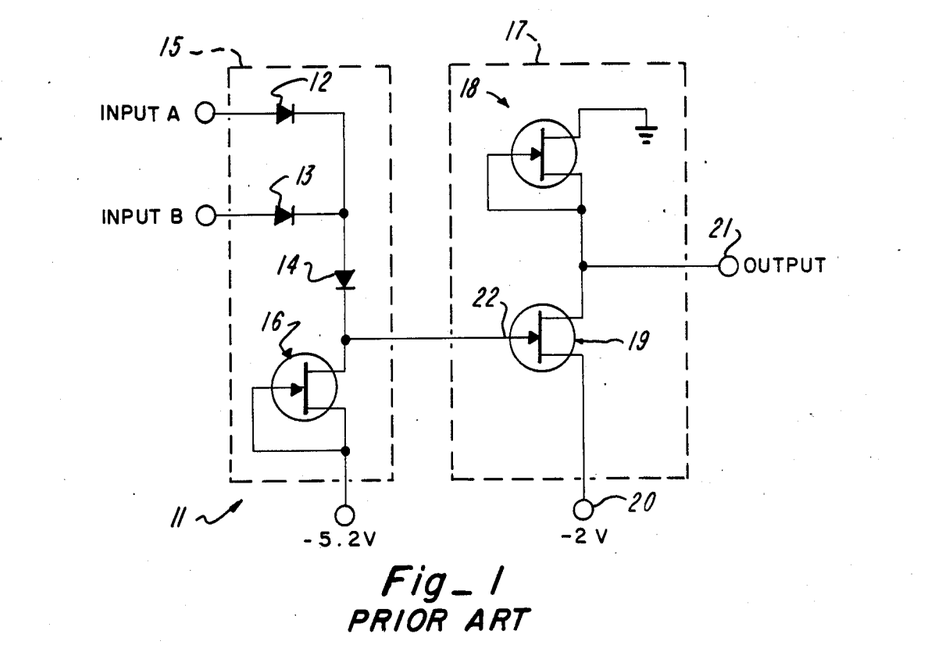
FIG. 1 is a schematic diagram of prior art NOR gate circuitry known as Schottky Diode FET Logic (SDFL).

Prior FET logic circuits have coupled FETs with parallel connected Schottky diodes used in an input stage (FIG. 1). When the FETs include an inverter FET in series with a pull up FET, with the output node between the FETs, the output voltage swing is limited by the voltage of a power supply connected to the inverter FET. This output voltage swing occurs under no loud or load conditions. When several such Schottky diodes are used in the input stage in series with a pull down FET to apply gate voltage to the inverter FET, the output voltage swing is substantially reduced since each Schottky diode in the input stage acts as an active pull down through the pull down FET. In such an SDFL circuit, any fan out requirements in excess of two or three input circuits can severely reduce noise margin due to reduced output voltage swing, increased output capacitance and current loading problems. This can result in the circuit itself reducing yield when used in a large scale logic gate array. Further, the input capacitance to such an SDFL circuit is relatively large due to the lack of isolation between the input stage and the gate of the inverter FET which exhibits Miller multiplication of its drain-to-gate capacitance.

Finally, the pull up FET and the output FET are sized large to provide the high output current needed to maintain fast switching speed of capacitive output loads. The large pull up FET size results in supplying high current to the next input stage.

Figure 2:
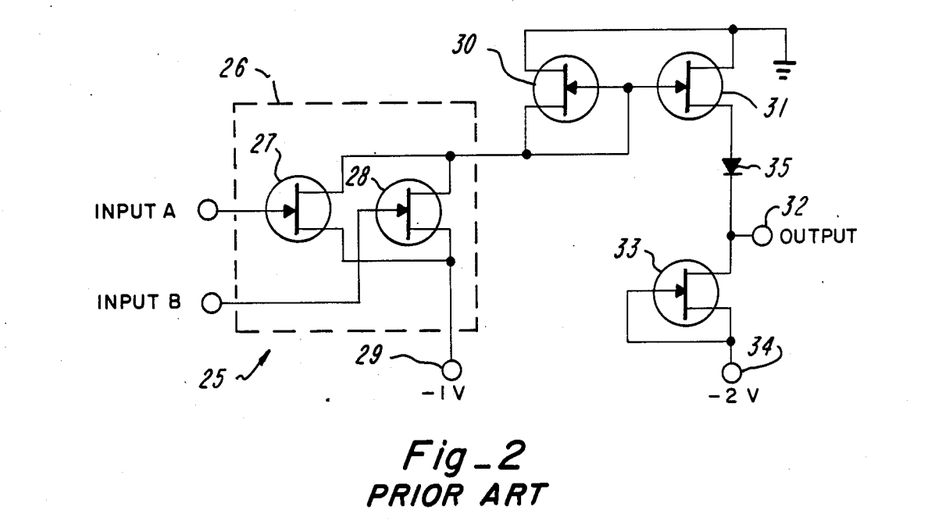
FIG. 2 is a schematic diagram of prior art NOR gate circuitry known as Buffered FET Logic (BFL).

In prior buffered FET logic (BFL), an input stage includes an inverter FET for each of the logic inputs (FIG. 2). The inverter FETs are connected in parallel across a power supply and a pair of output FETs. One of the pair of FETs is connected as an active load and one is connected as an output source-follower to ensure output signal compatibility with later logic stages. Such BFL is not limited by fan out problems as in SDFL because the inverter FETs form high impedance, low input current input stages that are coupled directly to the logic output without significant degradation of the input voltage levels, the input impedance, or the waveform rise time. However, if the input stages are connected to a $-1$ V power supply and an output FET is connected to a $-2$ V power supply for compatibility with voltages used with ECL circuits, the output voltage swing will be less than $-1$ V, rendering the noise margin poor and the BFL circuit thus very susceptible to noise pulses that can induce error signals into a large gate array. These error signals are caused, for example, by poor device matching and temperature variations that result in comparable input logic circuit FETs that have the same nominal threshold voltage actually having different threshold voltages. These variations also result in deviations from nominal in the output voltage swing. Such error signals are also caused by noise or voltage gradients due to IR drops.

On the other hand, if the output voltage swing to the input devices were increased (for increased noise margin) by changing the input stage power supply to −2 V and the output FET power supply to −5.2 V, there is a greater risk that the input would draw current due to forward biasing of the gatesource junction of the output FETs, which would limit the output voltage swing. Further, this would result in higher power consumption.

Also, where the output source-follower FET drives a Schottky diode connected to the output FET, more power is dissipated by the diode when a high capacitance load is connected to the output. The increased power dissipation results from the increased current that is required to maintain the switching speed of the circuit.

Known prior BFL and SDFL circuits have not limited the current to the gate of the output FET and have thus not overcome the problems which are overcome by the circuits of the present invention.

SUMMARY OF THE INVENTION

In contrast to the prior art that has not overcome the problem of heavily forward biasing of FETs, preferred embodiments of the present invention use either depletion-mode or both depletion and enhancement-mode GaAs logic with gate current limiters to achieve the following objectives.

Initially, GaAs logic circuits according to the present invention have a relatively high input impedance and relatively low input current that combine to enable a large number of such circuits to be connected in parallel, as may be required in large gate arrays.

Secondly, GaAs logic circuits according to the present invention may have relatively low input capacitance that provides a very large band-width and high cutoff frequency when many of the circuits are connected in parallel.

Thirdly, GaAs logic circuits fabricated according to the present invention have a relatively large output voltage swing that provides relatively high insensitivity to unwanted noise at the logic inputs to the circuits that would otherwise cause undesired changes in the output logic state. This large output swing is maintained under relatively adverse operating conditions in which an output FET is normally forward biased or in which it becomes forward biased at high temperatures, by limiting the forward biasing of the output FET in the circuit. Since the unwanted noise may be caused by capacitive coupling effects from long interconnect lines when the inputs of many of the circuits arranged in a gate array are connected in parallel, the advantages of these GaAs logic circuits are of special interest in the manufacture of large gate arrays.

Fourthly, a GaAs logic circuit according to the present invention renders device functionality and reliability largely independent of, and thus insensitive to, reasonable variations in processing parameters. This insensitivity is of special importance in the still early stages of the development of cost-effective, commercial depletion-mode and enhancement-mode GaAs devices. In contrast to the relatively mature silicon processing technology, these GaAs processes cannot be controlled closely enough to achieve consistency in the characteristics of the same type of device located at many different places in a large gate array. Therefore, individual gate array yield is significantly improved by the design of the GaAs logic circuits of the present invention that have the desired logic functions even though certain device operating characteristics may vary widely or the gate arrays are used under extreme operating conditions that vary device operating conditions.

With these objects in mind, a circuit in accordance with the present invention may be based on a GaAs logic design, where the logic circuit uses a FET to control the application of a logic signal from an input to an output. The FET inherently has parasitic gate-to-source and gate-to-drain diodes. A control signal applied to the gate of the FET controls the application of the logic signal to the output through the FET. Where the FET is an enhancement mode GaAs device, in an embodiment of the present invention the gate voltage can be of a value that tends to forward bias these diodes under all operating conditions and tend to significantly increase the gate current. In an embodiment of the present invention in which the FET is a depletion-mode device, adverse operating temperatures can cause such tendency to forward bias these diodes and other circuit diodes. A limiter circuit connected to the gate is effective to limit the gate current and thus limit the forward biasing of the parasitic and circuit diodes. This reduces the effect on the gate current of variations in the power supplies to the FET, process variations and operating temperature variations. Further, limiting the gate current limits the voltage drop resulting from the source resistance of the FET, maintaining the voltage swing of the logic signal at the output at desired levels. If the gate current were not limited, the resulting greater forward bias of those diodes would cause an increase in the current drain from a voltage supply that biases the FET. The unlimited forward bias would also result in a greater voltage drop from drain-to-source across the FET, reducing the $V_{OL}$ at the output and resulting in lower noise margin.

BRIEF DESCRIPTION OF THE DRAWINGS

Other objects, features and advantages of the present invention will be apparent from an examination of the following detailed descriptions which include the attached drawings in which.

DESCRIPTION OF THE PREFERRED EMBODIMENTS

Figure 3:
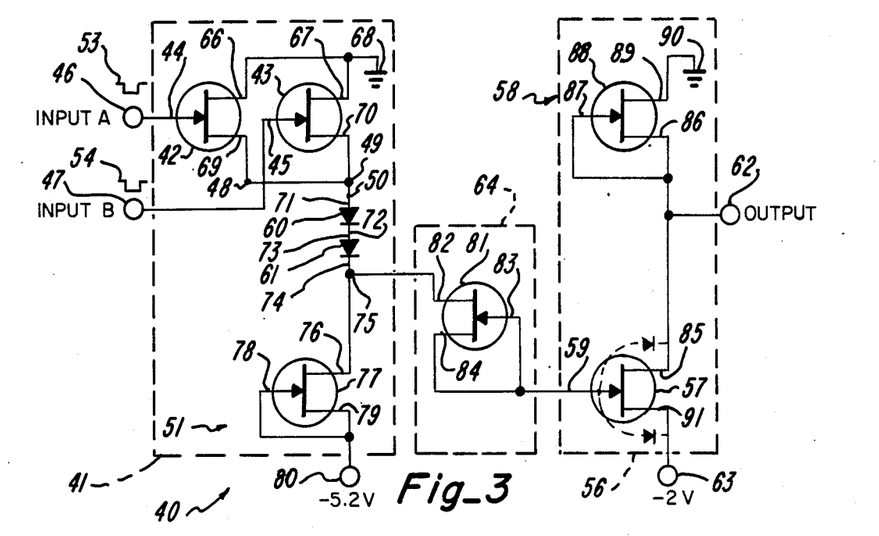
FIG. 3 is a schematic diagram of FET Diode FET Logic (FDFL) NOR gate circuitry illustrating a first preferred embodiment of the present invention.

The first preferred embodiment of the present invention is illustrated in FIG. 3 as a NOR gate implemented in a depletion-mode GaAs medium using Schottky gate technology.

As used herein, a "NOR" gate has an output "0" that is a "not or" function of inputs A, B, etc. This functional relationship between the logic inputs and outputs may be expressed as $0 = \overline{A + B}$ for the two input version of the FDFL circuit described herein. The truth table for a NOR gate is set forth in Table 1 below and relates the input logic 0 and 1 to the output logic of $\overline{A + B}$, which are "0" or "1".

TABLE 1

| NOR TRUTH TABLE | | |
|---|---|---|
| A | B | $\overline{A + B}$ |
| 0 | 0 | 1 |
| 0 | 1 | 0 |
| 1 | 0 | 0 |
| 1 | 1 | 0 |

With respect to the first preferred embodiment, the nominal voltage used herein that corresponds to the input logic 0 and to the output logic 0 is −1.85 V and that corresponding to the input logic 1 and to the output logic 1 is 0.0 V. With respect to the second preferred embodiment, the nominal voltage used herein that corresponds to the input logic 0 is −1.44 V and to the output logic 0 is −1.9 V and that corresponding to the input logic 1 is −1.16 V and to the output logic 1 is 0.0 V. These are referred to as $V_{IL}$, $V_{OL}$, $V_{IH}$ and $V_{OH}$, respectively.

The term "voltage swing" or "logic swing" is used herein to identify the difference in the nominal or actual output voltage levels $V_{OH}$ and $V_{OL}$ corresponding to logic 1 ad logic 0. A wide difference between the nominal $V_{OH}$ and $V_{OL}$ is desirable to render the various gates of a gate array insensitive to process and operational variables that may combine to narrow the actual difference in operation. The midpoint of the output voltage swing is the average of $V_{OH}$ and $V_{OL}$ and is referred to as "$V_{OM}$".

These voltages are referenced to "ground potential," which is a fixed reference potential. Thus, the 0.0 V potential is at ground potential whereas a low (−0.5 V) potential is nearer ground potential (more positive) than a higher (−1.8 V) potential. The nominal input and output logic voltage levels and the potentials of voltage supplies described herein have been selected for compatibility with voltage supplies used with ECL circuits. All of these voltages could be shifted by fixed amounts, or the circuits could be implemented using positive voltage supplies, but the circuit fundamentals of the present invention would still apply.

The term "threshold voltage" used herein with respect to an FET indicates the externally applied gate-to-source voltage which just pinches off the conducting channel at the source and is referred to as "$V_T$". A nominal $V_T$ is that $V_T$ that should be attained in the fabrication of the FET, but the actual $V_T$ attained may vary depending on process and other variables.

In regard to the output FET of the FDFL circuit of the first preferred embodiment of the present invention described above, for example, if the output FET is conducting (or ON) in response to an input logic signal level 1, as the input logic voltage falls to logic 0, the gate voltage $V_g$ applied to that FET drops to $V_{gM}$ and then to $V_T$ to render the output FET non-conducting (or OFF).

The term "insensitivity" is used herein to denote a characteristic of a second logic stage formed by an FDFL circuit of the first preferred embodiment of the present invention that it will operate in accordance with the NOR Truth Table (Table 1) even though the actual $V_T$ may vary relatively widely from nominal, and even though the actual output voltage levels $V_{OH}$ and $V_{OL}$ of a first logic stage formed by another FDFL circuit may vary relatively widely due to noise and IR drop in the power bus, such that the actual $V_{IH}$ and $V_{IL}$ applied by the first logic stage to the second logic stage of a gate array may be substantially different from nominal. The same term also denotes a characteristic of both preferred embodiments of the present invention that they will operate with desired logic even though the operating temperature has a relatively wide nominal range.

Figure 5A:
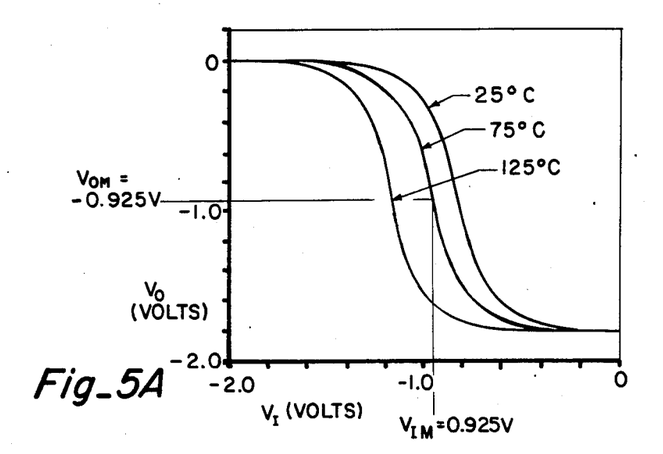
FIGS. 5A–5E, are graphs illustrating various operating characteristics of the GaAs logic circuitry of the present invention that provide intended logic functions relatively independently of variables in the processes used to fabricate the GaAs logic circuitry.

Referring to FIG. 5A, the term "noise margin" as used herein refers to the voltage difference, measured on the input voltage axis (abscissa) of the transfer characteristic (of a GaAs logic circuit of the first embodiment of the present invention, for example,) between the input operating point (either $V_{IH}$ or $V_{IL}$) and the nearest unity gain point, ie., where the slope $\Delta V_O/\Delta V_I = -1$. In the GaAs logic circuits of both preferred embodiments of the present invention, the noise margin is relatively high since the current limiter circuit keeps the output voltage swing close enough to its nominal value to maintain the desired logic operation of the circuits.

The advantages of the present invention may be better appreciated by first referring to a prior art SDFL circuit 11 shown in FIG. 1. The SDFL circuit 11 includes a pair of parallel connected input diodes 12 and 13 in series with a Schottky diode 14 to form an input circuit 15 with a pull down current supply 16. An output circuit 17 includes a pull up supply 18 connected to an inverter FET 19 coupled to a voltage supply 20. The output voltage swing $V_{OH} - V_{OL} - V_{OL}$ at an output 21 of the output circuit 17 is limited to approximately −1.8 V due to the voltage of the −2 V supply 20. This output voltage swing $V_{OH} - V_{OL}$ is substantially reduced since the input diodes 12 and 13 of the subsequent input circuit act as active pull downs through the pull down supply 16 of the subsequent input circuit. This reduction in voltage swing can amount to as much as 10 to 15 percent for each subsequent input circuit coupled to the output 21. In such an SDFL circuit 11, any fan out requirements in excess of two or three input circuits can severely degrade the noise margin due to reduced output voltage swing $V_{OH} - V_{OL}$, increased output capacitance and current loading problems. This can result in the circuit 11 itself reducing yield when used in a large scale logic gate array. Further, the input capacitance to such an SDFL circuit 11 is relatively large due to the lack of isolation between the input stage 15 and a gate 22 of the inverter FET 19 which exhibits Miller multiplication of its drain-to-gate capacitance.

Referring to FIG. 2, a typical buffered FET logic (BFL) circuit 25 includes an input stage 26 having inverter FETs 27 and 28 for each of logic inputs A and B. The inverter FETs 27 and 28 are connected in parallel across a power supply 29 and a pair of FETs 30 and 31. The FET 30 is connected as an active load and the FET 31 is connected as an output source follower to ensure output-signal compatibility with later logic stages. Such BFL circuit 25 is not limited by the fan out problems described above with respect to the SDFL circuit 11 because the inverter FETs 27 and 28 form high impedance, low input current input stages that are coupled directly to a logic output 32 without significant degradation of the levels of the input voltages $V_{IH}$ and $V_{IL}$, the input impedance or the waveform rise time. However, if the input stage 26 is fed by a $-1$ V power supply 29 and an output FET 33 is connected to a $-2$ V power supply 34 for compatibility with voltages used with ECL circuits, the output voltage swing $V_{OH}-V_{OL}$ will be less than $-1$ V, rendering the BFL circuit 25 very susceptible to noise pulses that can induce error signals into a large gate array. On the other hand, if the output voltage swing $V_{OH}-V_{OL}$ to the next input devices were increased (for increased noise margin) by changing the input stage power supply 29 to $-2$ V and the output FET power supply 34 to $-5.2$ V, there is a greater risk that the input would draw current due to forward biasing of the gate-source junction of the inverter FETs 27 and 28 which would limit the output voltage swing $V_{OH}-V_{OL}$. Further, this would result in higher power consumption due to the use of the $-5.2$ V supply 34.

Also, where the FET 31 drives a Schottky diode 35 connected to the output FET 33, more power is dissipated by the diode 35 when a high capacitance load (not shown) is connected to the output 32, as compared to using level shifting diodes (not shown) in the input circuit 26 where the current is less. The increased power dissipation by the diode 35 results from the increased current that is required to maintain the switching speed of circuit having the high capacitance load.

Prior BFL and SDFL circuits similar to the circuits 11 and 25 have not limited the current to the gates of the output FETs, such as the gate 22 to the output FET 19. Thus, these circuits 11 and 25 have not overcome the problems which are overcome by the circuits of the present invention.

Turning now to FIG. 3, a logic circuit 40 in accordance with a first preferred embodiment of the present invention may be based on an FDFL design. The FDFL circuit 40 includes an input circuit 41 having one input FET 42 when the FDFL circuit 40 is designed as an inverter (not shown), or at least two input FETs 42 and 43 when designed as a NOR logic circuit. The input FETs 42 and 43 have a gate 44 and 45, respectively, for connection to respective logic inputs 46 and 47. The FETs 42 and 43 have output terminals 48 and 49, respectively, connected to an intermediate terminal or node 50. The input circuit 41 includes a constant current pull down sink 51 that biases the input FETs 42 and 43.

Figure 5B:
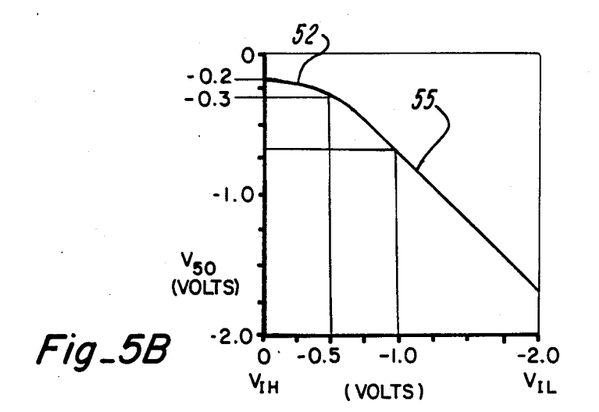

Referring to FIG. 5B, the transfer characteristics of the input FETs 42 and 43 are selected so that the input FETs 42 and 43 operate in the linear region 52 for a substantial part of the change of the nominal value of an input logic signal 53 or 54 from the high ($V_{IH}$) to the low ($V_{IL}$) logic state. This allows $V_{IH}$ to vary over a relatively wide range (shown as about 0.5 V) before the input FETs 42 and 43 reach the saturated region 55. In the saturated region 55, there is a selected nominal, relatively uniform voltage change $V_{gs42}$ across the input FETs 42 and 43.

Referring again to FIG. 3, an output circuit 56 is provided with an inverter or output FET 57 connected to a bias circuit 58. The output FET 57 has a gate 59.

When the input FETs 42 and 43 are operating in the saturated region 55 in a relatively low temperature range, the relatively constant voltage change $V_{gs}$ across the input FETs 42 and 43 partially offsets the relatively constant voltage drop $V_C$ across voltage level shift diodes 60 and 61 to provide gate voltage $V_g$ to the gate 59 of the output FET 57. This partial offsetting results in changes in $V_g$ in response to the input logic signals 53 and 54 such that $V_{OM}$ at an output 62 of the FDFL circuit 40 and $V_{IM}$ occur simultaneously at a selected value ($V_{gM}$) of the voltage applied to the gate 59 of the output FET 57. $V_{gM}$ represents the nominal $V_g$ that provides increased noise margin to the FDFL circuit 40 under actual operating conditions, rendering the FDFL circuit 40 relaively insensitive to variations in $V_{IH}$ and $V_{IL}$ of the input logic signals 53 and 54. Such insensitivity allows use of a relatively low power supply 63 to the output FET 57 without unreasonably limiting the nominal output voltage swing $V_{OH}-V_{OL}$ of rendering the next FDFL circuit (not shown) susceptible to triggering in response to unwanted noise in the connecting lines from the prior FDFL circuit 40.

Figure 5C:
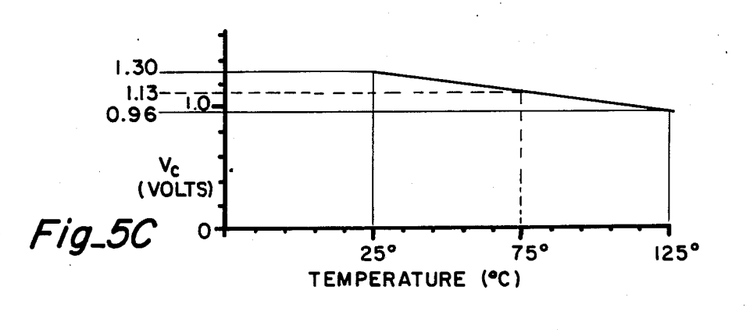

A current limiter circuit 64 is provided between the input circuit 41 and the gate 59 of the output circuit 56 to provide the circuit 40 with intended logic characteristics under a relatively wide range of operating conditions. In particular, the circuit 64 is effective to limit the gate current ($I_g$) to the output FET 57 even though the voltage supplied to the output FET 57 by the supply 63 becomes more negative than nominal under operating conditions. The circuit 64 also extends the nominal operating temperature range of the circuit 40. In particular, as shown in FIG. 5C, $V_C$ across the diodes 60 and 61 decreases as the temperature increases. As a result, the gate-to-source parasitic diode (shown in dashed lines in FIG. 3) of the output FET 57 will become more forward biased and the gate current $I_g$ will increase. At high operating temperatures, such as 125° C., and when the potential of the supply 63 becomes more negative than nominal, the circuit 64 is effective to limit $I_g$. Thus, at these adverse operating conditions, the gate current $I_g$ is rendered relatively independent of temperature-induced changes in the voltage drops across one or more of the diodes 60 and 61 of the voltage level shift circuit and across the gate-to-source junction diode (not shown) of the output FET 57. The limiting of $I_g$ limits the forward biasing of the gate-to-source diodes of the output FET 57. WIth $I_g$ limited, the source resistance of the output FET 57 will not produce an undesired voltage drop between the supply 63 and the output 62, which tends to maintain the output voltage swing $V_{OH}-V_{OL}$ at nominal value.

In greater detail and still referring to the first preferred embodiment of the present invention shown in FIG. 3, the FETs 42 and 43 of the input circuit 41 of the FDFL logic circuit 40 are each a depletion-mode metal semiconductor GaAs device using Schottky barrier gate technology (MESFET). The gates 44 and 45 are connected to the respective logic inputs 46 and 47 which correspond to respective inputs A and B in Table 1. Each of the gates 44 and 45 thus provides a separate logic input to the respective MESFETs 42 and 43. For simplicity, only two logic inputs 46 and 47 are shown, it being understood that in the first preferred embodiment of the present invention four logic inputs are used. Drains 66 and 67 of the MESFETS 42 and 43 are connected to ground 68 and sources 69 and 70 of the respective MESFETs 42 and 43 are connected to the respective output terminals 48 and 49 to form a parallel logic input network between ground 68 and the intermediate node 50. The MESFETs 42 and 43 are thus connected as source followers in series with an anode 71 of the voltage level shift diode 60 which has a cathode 72 connected to an anode 73 of the voltage level shift diode 61. A cathode 74 of the diode 61 is connected to an output terminal or node 75 of the input circuit 41.

In this preferred embodiment the diodes 60 and 61 are Schottky diodes that are forward biased and function as voltage level shifters for the digital signals applied to the intermediate node 50. One of the advantages of the FDFL circuit 40 is that the Schottky diodes 60 and 61 and the FETs 42 and 43 of the input circuit 41 require only one implant step. On the other hand, SDFL circuits can require an additional implant for optimizing the performance of certain circuit diodes.

Referring to FIG. 5C, it may be understood that at 25° C., the voltage drop $V_C$ in the digital signals across the diodes 60 and 61 is of about 1.3 V. In response to the constant current sink 51, at this temperature this combined drop of $V_C = -1.3$ V is constant when either logic 0 or logic 1 is applied to the logic inputs 46 and 47. $V_C$ at 25° C. is used as one of the nominal conditions in designing the FDFL circuit 40. As shown in FIG. 5C, the voltage drop $V_C$ varies uniformly with temperature. As a result, as the temperature increases above 25° C. the potential at the output node 75 will increase.

It is to be understood that $V_C$ is a characteristic of the GaAs semiconductor material that is dependent on the bandgap energy and thus cannot be significantly altered in the design of the FDFL circuit 40 using GaAs material. As a result, in the first preferred embodiment of the present invention if a $V_C$ at 25° C. of more than $-0.65$ V is required, more than one diode 60 must be used. Thus the input circuit 41 is shown in FIG. 3 with two diodes 60 and 61 to produce the total $V_C$ of $-1.3$ V.

Still considering FIG. 3, it may be understood that the drain 76 of a FET 77 of the constant current sink 51 is connected to the output node 75 of the input circuit 41. The FET 77, like the FETs 42 and 43, is a depletion-mode GaAs metal semiconductor field effect transistor (MESFET). A gate 78 of the MESFET 77 is connected to a source 79 to turn the MESFET 77 ON. In this manner, with $-5.2$ V applied to a supply terminal 80 of the sink 51, the MESFET 77 always conducts so that there is relatively constant current through the Schottky diodes 60 and 61 from ground 68. Such current is conducted through whichever MESFET 42 or 43 has the highest potential applied to its gate. Thus, for example, when logic 1 is applied to the gate 44 of the MESFET 42 and logic 0 is applied to the gate 45 of the FET 43, the FET 42 will conduct all the current to the sink 51. In the event that logic 1 or logic 0 is applied to both gates 44 and 45, and assuming the actual voltage applied to each gate is the same, then there will be equal current through each of the FETs 42 and 43 to the sink 51.

It may be appreciated that since the Schottky diodes 60 and 61 are in the input circuit 41, and since the constant current to the sink 51 is less than that in Schottky diodes used in output circuits of the BFL circuit 25 (FIG. 2), the FDFL circuit 40 may dissipate less power than comparable BFL circuits.

The $V_g$ appearing at the output terminal 75 of the input circuit 41 is applied to the current limiter circuit 64. The circuit 64 includes a depletion-mode GaAs metal semiconductor field effect transistor (MESFET) 81 having a drain 82 connected to the output terminal 75. The gate 83 and a source 84 of the MESFET 81 are coupled and connected to the gate 59 of the output FET 57.

Figure 5D:
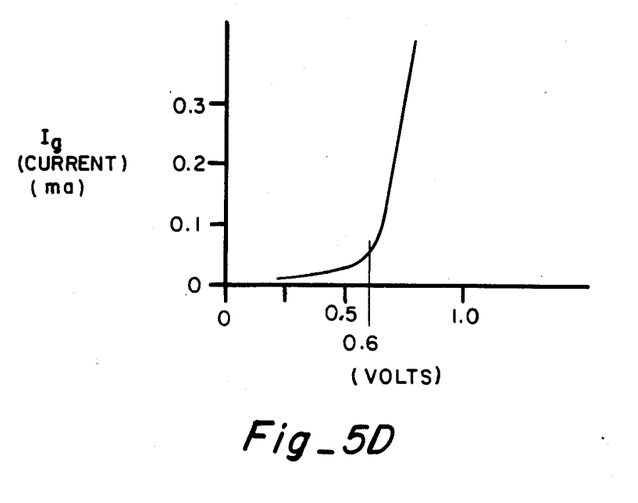

The output FET 57 has parasitic diodes (shown in dashed lines in FIGS. 3) from gate-to-drain and gate-to-source. These diodes exhibit well-known diode characteristics shown in FIG. 5D in which the current conducted by the diode increases exponentially as the voltage drop across the diode increases beyond the turn-on voltage of about 0.6 V. The current limiter circuit 64 is effective to limit the gate current $I_g$ to these diodes such that the voltage drop across them cannot increase sufficiently to allow the current through them to increase exponentially.

The drain 85 of the output FET 57 is connected to the output 62 of the FDFL circuit 40. The output 62 is connected to a source 86 that is connected to a gate 87 of a pull up FET 88 of the bias circuit 58. The drain 89 of the pull up FET 88 is connected to ground 90. The FETs 57 and 88, like the MESFETs 42 and 43, is a depletion-mode GaAs metal semiconductor field effect transistor (MESFET).

The source 91 of the output MESFET 57 is connected to the low power supply 63 of the bias circuit 58 to apply $V_s = -2$ V to the source 91. The $-2$ V $V_s$ potential provides a reasonable range for the nominal voltage swing ($V_{OH} - V_{OL}$) at the output 62.

The current limiter FET 81 is designed so that at nominal supply voltage from the supply 63 and relatively low temperature levels to 100° C., it represents a low impedance path from the intermediate node 75 to the gate 59 of the output FET 57. The FET 81 is provided with a gate area that is related to that of the FET 57 so that it will be effective to limit the gate current $I_g$ enough to prevent undesired high voltage drops across the diodes, which would reduce the output voltage swing $V_{OH} - V_O$, and yet allow high enough $I_g$ to allow the capacitance of the FET 57 to be charged at a desired rate. In particular, in the first preferred embodiment the ratio of the gate area of the FET 81 to that of the FET 57 is 3.33:1.

Reference is now made to FIG. 3 in conjunction with Table 2 for a description of the operation of the first preferred embodiment of the present invention. The circuit 40 is responsive to a nominal logic level 1 of 0.0 V ($V_{IH}$) and a nominal logic level 0 of $-1.85$ V ($V_{IL}$) of the input logic signals 53 and 54. The terminal 80 of the current sink 51 is biased by between $-3.5$ and $-5.2$ V, and a $-2$ V potential is applied to the source 91 of the output FET 57 by the low power supply 63 of the bias circuit 58. In this condition, the MESFET 77 is biased to stay ON and to draw nominally constant current from ground 68.

TABLE 2

| Input Logic Level | Input Signal (Volts) $V_I$ | Voltage Change FET 42/43 (Volts) | Voltage Change Diodes $V_C$ (Volts) | Gate Voltage $V_{g57}$ (Volts) | Source Voltage $V_{s57}$ (Volts) | Gate-Source Voltage FET 57 $V_{g57}$ (Volts) | Output Voltage $V_O$ (Volts) | Output Logic Level |
|---|---|---|---|---|---|---|---|---|
| A or B or Both "1" | 0 ($V_{IH}$) | −0.2 | −1.3 | −1.5 | −2.0 | +0.5 | −1.85 ($V_{OL}$) | 0 |
| Both A & B "0" | −1.85 ($V_{IL}$) | +0.3 | −1.3 | −2.85 | −2.0 | −0.85 | 0 ($V_{OH}$) | 1 |
| Both A & B "0" | −1.1 | +0.3 | −1.3 | −2.1 | −2.0 | −0.1 | 0 | 1 |
| Mid-Swing | −1.0 ($V_{IM}$) | +0.3 | −1.3 | −2.0 | −2.0 | 0 | −0.925 ($V_{OM}$) | Mid-Swing |

Referring also to FIG. 5B, the transfer characteristic of the MESFETs 42 and 43 is shown. Assuming logic 1 is applied to the gate 44 of the MESFET 42 and logic 0 is applied to the gate 45 of the MESFET 43 (see the first line of Table 2), the MESFET 42 will conduct all the current to the sink 51. With the input logic signal 53 applying $V_I$ of 0.0 V to the gate 44 and $V_{ds}=0.2$ V across the MESFET 42, the source 69 will slowly follow the input logic signal 53 as it becomes negative in the linear region 52. This results in a relatively constant voltage $V_s$ at the source 6 and $V_{50}$ at the intermediate node 50 until the FET 42 operates in the saturated region 55. As shown in the first line of Table 2, with $V_I=0.0$ V, the voltage change across the FET 42 is −0.2 V, which is added to $V_C$ to produce a voltage of −1.5 V at the output node 75 of the input circuit 41. This voltage is applied to the drain 82 of the FET 81. The −1.5 V potential is applied as $V_{g57}$ to the gate 59 of the output MESFET 57 and is positive relative to the −2 V $V_{s57}$ potential, and is +1.0 V relative to $V_T$ of the output MESFET57. The output MESFET 57 will thus conduct and apply the −2 V potential from the supply 63, less the −0.15 V source-to-drain voltage drop across the output MESFET 57, to the output 62. As a result, the output voltage $V_{OL}$ is −1.85 V, resulting in a logic 0 at the output 62, as shown at the right hand side of line 1 in Table 2.

The same logic 0 at the output 62 will result if logic 1 is applied by both of the logic signals 53 and 54. However, if the voltage level of both logic 1 is relatively the same, the current will be shared by the FETs 42 and 43, with the same −0.2 V voltage change being offset by $V_C$ to produce the −1.5 V potential at the output node 75, which is $V_{g57}$ in Table 2.

As shown in FIG. 5B with the MESFET 43 OFF, as $V_{IH}$ of the input signal 53 becomes negative, the source voltage $V_{s42}$ of the MESFET 42 (in FIG. 5B shown as $V_{50}$ at the intermediate node 50) will stay relatively the same so that voltage $V_{g57}$ applied to the gate 59 of the output MESFET 57 will be relatively constant until $V_I$ reaches the saturated region 55. Since the linear region 52 is relatively wide in terms of $V_I$, the actual $V_I$ can vary about −0.5 V from the nominal $V_{IH}$ of 0.0 V before there will be any significant effect on the voltage $V_{57}$ applied to the gate 59 of the output FET 57. Thus, the FDFL circuit 40 is relatively insensitive to variations in $V_{IH}$.

As $V_I$ of the input signal 53 goes more negative (with $V_I$ of the input signal 54 = −1.85 V), it reaches $V_{IM} = −1.0$ V (see the last line of Table 2) and the input MESFET 42 is in the saturated region 55. As shown in FIG. 5A there is a selected, nominal voltage change of +0.3 V across the input MESFET 42, which partially offsets $V_C$ of −1.3 V across the diodes 60 and 61 to produce a $V_{g57}$ of −2.0 V applied to the gate 59 of the MESFET 57. In the preferred embodiment of the FDFL circuit 40 shown in FIG. 3, the −2.0 V $V_{g57}$ is the nominal $V_{gM}$ that results in $V_{IM}$ of −1.0 V and $V_{OM}$ of −0.925 V occurring simultaneously. This value of $V_{gM}$ is obtained by making the gate area of the MESFETs 42 and 43 larger than what would otherwise be used. Further, the gate area of the MESFETs 42 and 43 is related to that of the pull down MESFET 64. For example, if the lengths of the gates 44, 45 and 77 are the same, the ratio of the channel width of the gates 44 and 45 to that of the gate 77 is about 2:1, with the ratio being 1.71:1 for the preferred embodiment of the FDFL circuit 40 shown in FIG. 3. Such selected gate area of the input MESFETs 42 and 43 relative to that of the pull down MESFET 64 provides the +0.3 V voltage change across MESFETs 42 or 43 that selectively offsets the nominal $V_C$ of −1.3 V across the two diodes 60 and 61 to result in $V_{IM}$ and $V_{OM}$ occurring at substantially the same time as shown in FIG. 5A.

When the logic level 0 is applied by both logic signals 53 and 54, a −1.85 V potential $V_{IL}$ is applied to both of the gates 44 and 45. The current from ground 68 to the pull down sink 51 is shared by the FETs 42 and 43 so that the +0.3 V voltage change across both MESFETs 42 and 43 partially offsets $V_{IL}$ and a −1.6 V potential $V_{50}$ appears at the intermediate node 50. The nominal voltage drop $V_C$ lowers the −1.6 V potential $V_{50}$ to produce a nominal $V_{g57}$ of −2.85 V at the gate 59. With $V_{g57}$ thus negative relative to the nominal $V_T$ of −0.5 V and $V_{gs57}$, the FET 57 is OFF. Thus the potential of ground 90 appears at the output 62, which is $V_{OH}$ or logic 1. The nominal $V_{g57}$ of −2.85 V results in a gate-to-source voltage ($V_{gs57}$) across the MESFET 57 of −0.85 V, which is substantially different from the 0.0 V $V_{gs57}$ resulting from the nominal $V_g$ of −2.0 V for $V_{OM}$. Such substantial difference allows the actual voltage values of the input signals 53 and 54 to vary considerably before the actual $V_{g57}$ will be equal to $V_{gM}$ that is required for $V_{OM}$, which would result in an undesired logic output of 0. The FDFL circuit 40 is thus relatively insensitive to changes in the voltage values of the input signals 53 and 54.

As an example of the range of insensitivity of the FDFL circuit of the first preferred embodiment of the present invention, the third line in Table 2 shows another set of conditions for logic 0 of both logic signals 53 and 54. In this case, the actual $V_{IL}$ has risen to $-1.1$ V from the nominal value of $-1.85$ V. This results in a potential $V_{50}$ at the intermediate node 50 of $-0.8$ V and a voltage $V_{g57}$ of $-2.1$ V applied to the gate 59 of the MESFET 57. Despite this change of 0.75 V in the actual $V_{IL}$ as compared to the nominal $V_{IL}$, $V_{g57}$ is still negative relative to the $V_{g57}$ that is required to produce $V_{OM}$ such that the MESFET 57 is only partially ON. While parameters other than $V_{IL}$ (such as $V_T$ and $V_{gs57}$) may vary at the same time as $V_{IL}$ varies, the 0.75 V tolerance in $V_I$ and the above-described $-0.85$ V tolerance in $V_{g57}$ are relatively wide and foster greater yield when the FDFL circuit 40 is used in large gate arrays.

Figure 5E:
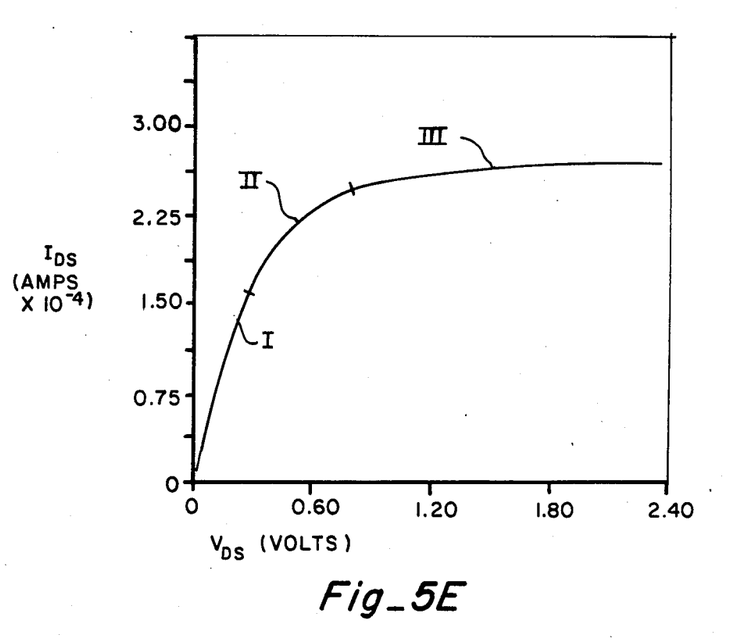

In the foregong description of the operation of the FDFL circuit 40, the operating temperature was at the 25° C. value for which $V_C$ was nominally $-1.3$ V. Referring to FIG. 5E, the drain current $I_D$ of the FET 81 varies linearly with the drain-to-source voltage $V_{DS}$ of the FET 81 as shown in region I. The FET 81 exhibits relatively constant impedance in region I, also. However, as the temperature increases to upwards of 125° C., the voltage drop will continue to decrease as indicated in FIG. 5C, resulting in substantially increased voltage applied to the drain 82 of the output MESFET 81 and increased $V_{DS}$. Under adverse operating conditions the voltage of the supply 63 may become more negative such that $V_{DS}$ across the FET 81 will increase more and the $I_D$ vs. $V_{DS}$ relationship reaches region II where the impedance starts varying. With further temperature increase and drop in the voltage supplied by the supply 63 rendering the operating conditions more adverse, the $I_{DS}$ vs $V_{DS}$ relationship is shown by region III in which $I_D$ is relatively constant and the impedance is high. This counteracts the drop in the voltage drop $V_C$.

Because the current limiter MESFET 81 limits the current to the gate 59 of the output FET 57, the current limiter circuit 64 is effective to maintain the nominal output voltage swing $V_{OH}-V_{OL}$ under these adverse operating conditions. In particular, if the gate current to the output MESFET 57 were to increase in response to the reduced $V_C$ and more negative supply voltage, the source resistance inherent in the output MESFET 57 would produce an undesired voltage drop, which would add to the $-0.15$ V drain-to-source voltage drop of the output MESFET 57 and result in a lower $V_{OL}$ than the nominal $-1.85$ V potential referred to above, reducing the voltage swing by the amount of this undesired voltage drop.

The advantages of the current limiter circuit 61 may be appreciated by referring to Table 3.

TABLE 3

| Measured Parameter | DC Performance Characteristics of Circuit 40 | | | |
| --- | --- | --- | --- | --- |
| | Junction Temperature (°C.) | | | |
| | 25 | 75 | 125 | Unit |
| $V_{OH}$ | 0.0 | 0.0 | 0.0 | V |
| $V_{OL}$ | $-1.8$ | $-1.8$ | $-1.8$ | V |
| $V_{IH}$ | $-0.62$ | $-0.80$ | $-1.05$ | V |
| $V_{IL}$ | $-1.05$ | $-1.15$ | $-1.26$ | V |
| High Noise Margin | 0.62 | 0.80 | 1.05 | V |
| Low Noise Margin | 0.75 | 0.65 | 0.54 | V |

($V_{63} = -2$ V. $V_{80} = -5.2$ V)

Table 3 shows the results of testing early prototypes of the FDFL circuit 40 of the present invention. While the results are based on early prototype testing, they are believed to illustrate the benefits of using the limiter circuit 64. It is seen in Table 3 that the high noise margin increases with temperature which is contrary to results expected without the circuit 64. Also, although the low noise margin decreases with increasing temperature, the 0.54 value at 125° C. is an acceptable value.

A NOR logic, FDFL circuit 40 could be designed with one diode 60 to use less chip area and to allow smaller input MESFETs 42 and 43 to be used. In this case, with the gate lengths the same the channel width for each of the input FETs 42 and 43 would be about a 1:2 ratio relative to that of the pull down MESFET 77. The channel widths of the output MESFET 57 and the pull up MESFET 88 would remain the same. With these changes in the gate area of the input FETs 42 and 43 relative to that of the pull down MESFET 77, the voltage change across the input MESFETs 42 and 43 will be 0.4 V. The partial offset resulting from the combination of this voltage change with the $-0.65$ V voltage drop across the diode 60 is such that if a nominsl $V_{IM}$ of 0.95 V is applied to the input MESFET 42, $V_{gM57}$ will be the $-2.0$ V value required to have $V_{gs57}$ be 0.0 V for $V_{OM}$ of 0.95 V. The term "partial offset" is used in this situation (where only one voltage level shift diode 60 is used) to refer to the voltage change across the MESFETs 42 and 43 that is of the same polarity as that of $V_C$ across the diode 60, which results in the desired value of $V_{gM57}$.

Figure 4:
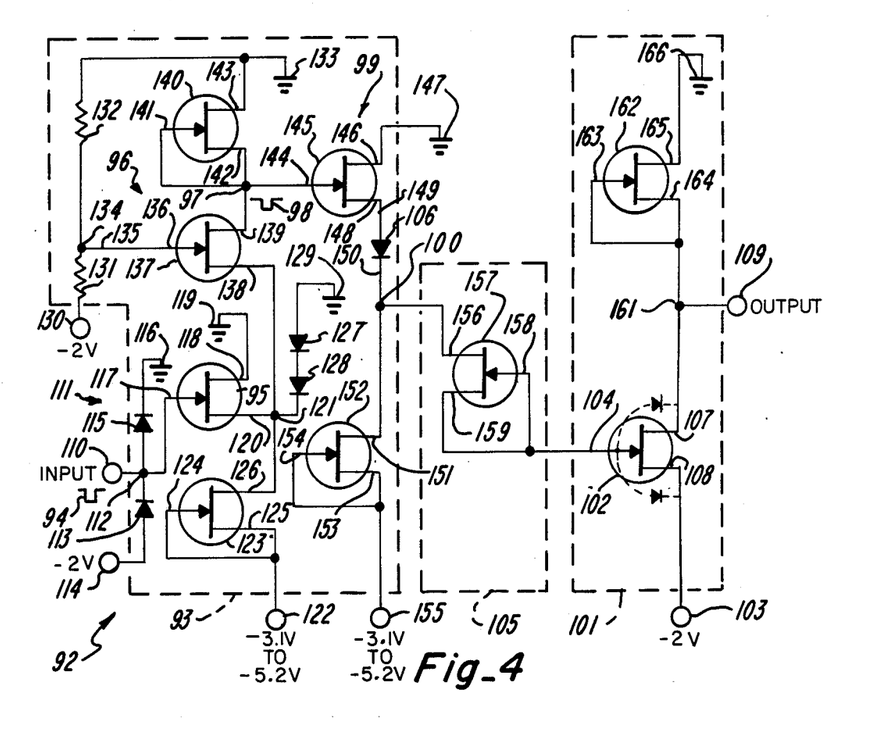
FIG. 4 is a schematic diagram of inverter circuitry illustrating a second preferred embodiment of the present invention which is responsive to input logic having a relatively small voltage swing.

Referring now to FIG. 4, a second preferred embodiment of the present invention is shown as an inverter implemented in both depletion-mode and enhancement-mode, GaAs medium using Schottky gate technology. The second preferred embodiment includes a GaAs logic circuit 92 provided with an input circuit 93 that is responsive to an input logic signal 94 having a relatively small voltage swing $V_{IH}-V_{IL}$. The input logic signal 94 is applied to an input FET 95 connected to a bias circuit 96 for providing at an intermediate node 97 a logic signal 98 that corresponds to but has a larger voltage swing than the input logic signal 94. The intermediate node 97 is coupled to a voltage level shift circuit 99 to provide at an output node 100 of the input circuit 93 voltage levels that are compatibkle with an output circuit 101. The output circuit 101 includes an output FET 102 and a voltage supply 103 for biasing the output FET 102 to high or low conduction states selectively in accordance with the level of voltage $V_g$ applied to a gate 104 of the output FET 102.

A current limiter circuit 105 is provided between the voltage level shift circuit 99 and the gate 104 of the output FET 102 to provide the GaAs logic circuit 92 with intended logic under operating conditions. In particular, the current limiter circuit 105 is effective to limit the current to the gate 104 of the output FET 102. By limiting the current to the gate 104, the current limiter circuit 105 prevents a voltage level shift diode 106 in the voltage shift circuit 99 and a parasitic gate-to-source junction diode (shown in dashed lines in FIG. 4) of the output FET 102 from becoming heavily forward biased. If not limited, the resulting increased forward bias would cause an increase in current drain from the voltage supply 103 which would also result in a greater voltage drop from the drain 107 to the source 108 of the output FET 102, reducing $V_{OL}$ at an output 109 of the GaAs logic circuit 92 and resulting in lower noise margin $V_{OH}-V_{OL}$.

Referring now in greater detail to FIG. 4, an input terminal 110 is shown for receiving the input logic signal 94. An input protection circuit 111 connected to a node 112 includes a diode 113 connected to a terminal 114 that applies a −2.0 V signal to the diode 113. A second diode 115 is connected between ground 116 and the node 112 to complete the input protection circuit which operates in a well known manner to protect the input FET 95 from electrostatic discharge damage.

A gate 117 of the input FET 95 is coupled to the node 112 for response to the input logic signal 94. A drain 118 of the input FET 95 is connected to ground 119 and a source 120 of the input FET 95 is connected to a node 121. The node 121 is connected to a terminal 122 through a pull down FET 123 that forms part of the bias circuit 96. The terminal 122 is supplied with between −3.1 V and −5.2 V. The pull down FET 123 has a gate 124 connected to a source 125 connected to the terminal 122. The FET 123 is also provided with a drain 126. The pull down FET 123 operates as a current sink with respect to the node 121 and biases the input FET 95 for operation in response to the input logic signal 94. Series connected diodes 127 and 128 are connected between ground 129 and the node 121 and are effective to clamp the voltage at the node 97 at −1.2 V when the input FET 95 is biased by the input logic signal 94 to the OFF condition. The bias circuit 96 also includes a terminal 130 connected to a first resistor 131 connected in series with a second resistor 132 to ground 133. A node 134 connected between the resistors 131 and 132 is connected by a conductor 135 to a gate 136 of a comparator FET 137. A source 138 of the comparator FET 137 is connected to the node 121 whereas a drain 139 of the FET 137 is connected to the intermediate node 97. The resistors 131 and 132 are selected to provide a nominal −1.296 V potential at the node 134, which is selected to be at the midpoint of the worst case input voltage swing. The bias circuit 96 cooperates with the input FET 95 so that the logic signal 98 varies in proportion to the difference in the voltage levels applied to the gate 136 and to the gate 117 by the input signal 94.

A current source transistor 140 having a gate 141 connected to a source 142 is connected to the intermediate node 97. A drain 143 of the current source transistor 140 is connected to ground 133.

The FETs 95, 123, 137 and 140 are each a depletion-mode metal semi-conductor GaAs device using Schottky barrier gate technology (MESFET). The respective gate areas of the MESFETs 95, 123, 137 and 140 are shown in Table 4 to the nearest one-half (micron)$^2$.

TABLE 4

| FET | Gate Areas (microns)$^2$ |
|---|---|
| 95 | 28 |
| 102 | 50.5 |
| 123 | 8.5 |
| 137 | 28 |
| 140 | 4.0 |
| 145 | 4.0 |
| 152 | 8.5 |
| 157 | 8.5 |
| 162 | 12.5 |

It may be appreciated that the input MESFET 95 provides an input to the input circuit 93 according to the logic level of the input logic signal 94. The pull down MESFET 123 functions as a current sink such that with the gate 136 of the comparator MESFET 137 biased by the −1.296 V potential signal from the node 134 and with the gate 117 of the input MESFET 95 biased by the input logic signal 94 of a potential lower than −1.296 V, the input MESFET 95 will be OFF. In this condition, current will flow from ground 133 through the MESFETs 140, 137 and 123 to the terminal 122. This pulls the intermediate node to a potential of −1.2 V in response to the diodes 127 and 128. In response to potentials of the input logic signal 94 of from −1.296 V through $V_{IL}$ of −1.44 V, the input MESFET 95 remains OFF because the gate 136 of the comparator MESFET 137 held at −1.296 V so that the potential at the source 138 of the comparator MESFET 137 is applied to the node 121 and maintains the input MESFET 95 OFF. As the voltage level of the input logic signal 94 rises just slightly above the −1.296 V potential applied to the comparator MESFET 137, the input MESFERT 95 turns ON and all of the current drawn by the pull down MESFET 123 flows from ground 119 through the input MESFET 95 and through the pull down MESFET 123 to the terminal 122. As a result, the comparator MESFET 137 is effectively OFF such that the voltage at the node 97 rises to 0.0 V.

When equal voltage is applied to the gate 136 of the comparator MESFET 137 and to the gate 117 of the input MESFET 95, both the input MESFET 95 and the comparator MESFET 137 are ON such that the current drawn by the pull down MESFET 123 is split and flows through the input MESFET 95 and through the comparator FET 137. As shown in Table 4, the MESFET 140 is provided with a gate area about half that of the pull down FET 123 such that the MESFET 140 operates in a high gain region. As a result, the MESFET 140 is very sensitive to changes in the voltage at the node 97. Thus, as soon as the MESFET 140 is biased to supply more current than half of that through the pull down MESFET 123, then the potential at node 97 drops very rapidly. On the other hand, as soon as the MESFET 140 is biased to supply less current from ground 133, the voltage at the node 97 rises very rapidly. As a result, with just a small input logic level swing of the input logic signal 94 from $V_{IL}$ of −1.44 V to $V_{IH}$ of −1.16 V, the voltage at the node 97 swings between 0.0 V (corresponding to $V_{IH}$) and −1.2 V (corresponding to $V_{IL}$). As a result, the logic signal 98 is substantially amplified and has the same logic states as that of the input logic signal 94. This enables the input circuit 93 to be responsive to a voltage swing $V_{IH}-V_{IL}$ of about 280 millivolts of the input logic signal 94. The input circuit is thus very sensitive to the relatively small voltage swing of the input logic signal 94.

The amplified logic signal 98 at the node 97 is applied to a gate 144 of a MESFET 145 of the voltage level shift circuit 99. A drain 146 of the MESFET 145 is connected to ground 147, whereas a source 148 of the MESFET 145 is connected to an anode 149 of the diode 106. The cathode 150 of the diode 106 is connected to the output node 100 of the input circuit 93. The output node 100 is connected to a drain 151 of a pull down MESFET 152 having a source 153 connected to a gate 154. The source 153 is connected to a terminal 155 that supplies potential of from −3.1 to −5.2 V. The MESFET 152 is effective as a current sink to bias the MESFET 145 and the diode 106 such that voltage level shifting of the amplified logic signal 98 occurs for compatibility with the desired output logic levels at the output 109.

The output node 100 of the input circuit 93 is connected to a drain 156 of a current limiter MESFET 157 of the current limiter circuit 105. A gate 158 of the MESFET 157 is connected to a source 159 which is connected to the gate 104 of the output FET 102. The FET 102 is an enhancement-mode, metal semiconductor GaAs device using Schottky barrier gate technology.

The drain 107 of the output FET 102 is connected to an output node 161 which is connected to a pull up FET 162 having a gate 163 connected to a source 164 and the output node 161. The drain 165 of the pull up FET 162 is connected to ground 166.

Still referring to FIG. 4, when the potential at the output node 100 of the input circuit 93 is −2.0 V, the current limiter MESFET 157 is effective to apply the −2.0 V potential $V_g$ to the gate 104 of the output FET 102. In this condition, the output FET 102 is OFF such that the pull up MESFET 162 is effective to pull the output node 161 up to ground potential. The output 109 thus sees a high potential $V_{OH}$ of 0.0 V or logic 1.

The voltage at the node 100 rises rapidly in response to a change in the input logic signal 94 from logic 0 to logic 1. The $I_{DS}$ vs. $V_{DS}$ relationship shown in FIG. 5E for the FET 81 applies to the MESFET 157, except that region III starts at 0.3 V. Thus, it may be understood that when $V_{DS}$ across the current limiter MESFET 157 reaches 0.3 V, the MESFET 157 operates in the constant current, high impedance region III. In this condition, a voltage drop appears across the current limiter MESFET 157 and the gate 104 of the output FET 106 is effectively clamped at −1.3 V. As a result of this action by the current limiter MESFET 157, the voltage at the output node 100 rises to −0.8 V representing the full voltage swing to logic 1. In view of this, undesired signals at the input 110 that may otherwise prevent the amplified signal 98 from rising completely to 0.0 V are less likely to cause the potential at the output node 100 to fall below the voltage which would prevent the output FET 102 from turning ON. Further, with the output FET 102 turned ON, the pull up MESFET 162 will conduct from ground 166 through the now ON output FET 102 to the terminal 103. In this condition, the −2.0 V potential at the terminal 103 is applied to the now ON output FET 102 which drops the potential by 0.1 V such that a −1.9 V potential appears at the output node 161. As a result, logic 0 appears at the output 109 of the output circuit 101. It may be understood that because the current limiter MESFET 157 is effective to limit the gate-source current through the output FET 102, the power dissipated by the output circuit 101 is reduced.

Considering the operation of the GaAs logic circuit 92, reference is made to Table 5.

TABLE 5

| Input Logic Level | 1 | 0 |
|---|---|---|
| Voltage of input signal 94 (V.) | −1.16 ($V_{IH}$) | −1.44 ($V_{IL}$) |
| Voltage of amplified signal 98 (V.) | 0 | −1.2 |
| Vc = Voltage change across 99 (V.) | −0.8 | −0.8 |
| Voltage at node 100 (V.) | −0.8 | −2.0 |
| State of FET 102 | ON | OFF |
| Gate Voltage $V_g$ 102 (V.) | −1.3 | −2.0 |
| Output Logic Level | 0 | 1 |
| Voltage at Output 109 | −1.9 ($V_{OL}$) | 0 ($V_{OH}$) |

As shown in Table 5, in response to logic 0 of the input logic signal 94, the −1.44 V potential is applied to the input terminal 110. Because the gate 136 of the comparator MESFET 137 is biased at the −1.296 V potential, the −1.44 V potential will not turn the input MESFET 95 ON. accordingly, the MESFETs 140, 137 and 123 conduct from ground 133 to the high voltage potential 122 such that the intermediate node 97 is pulled down to a potential of −1.2 V by the action of the series connected diodes 127 and 128. The −1.2 V amplified signal 98 is applied to the voltage level shift circuit 99. The amplified signal 98 is voltage-level-shifted by $V_C$ so that the −2.0 V potential appears at the output node 100. In this condition, $V_g$ of −2.0 V is applied to the gate 104 of the output FET 102 placing the output FET 102 in the OFF condition. With the output FET 102 OFF, the pull up FET 162 is effective to apply ground potential to the output node 161 such that the logic 1 appears at the output 109.

As the voltage level of the input logic signal 94 rises to the −1.296 V level, the gate 136 of the comparator MESFET 137 is held at −1.296 V by the voltage divider circuit formed by the resistors 131 and 132. In this condition, the potential at the source 138 of the MESFET 137 is applied to the node 121 to maintain the input MESFET 95 OFF. However, as the voltage of the input logic signal 94 rises just above the −1.296 V potential applied to the gate 136 of the comparator MESFET 137, the input MESFET 95 will turn ON. In this condition, all of the current drawn by the pull down MESFET 123 flows from ground 119 through the input MESFET 95 and through the pull down MESFET 123 to the terminal 122. As a result, the comparator MESFET 137 is effectively in the OFF condition such that the amplified voltage of the logic signal 98 rises to 0.0 V. The amplified logic signal 98 is applied to the gate 144 of the MESFET 145 of the voltage level shift circuit 99 which is effective to drop the potential at the output node 100 by $V_C$ to −0.8 V.

As the voltage at the output node 100 rises from −2.0 V, the current limiter MESFET 157 and the output FET 102 will conduct. With the current limiter MESFET 157 then operating in the constant current, high impedance region III shown in FIG. 5E, the MESFET 157 is effectibve to limit the potential $V_g$ applied to the gate 104 to −1.3 V. In this condition, the output FET 102 conducts and applies the −2.0 V potential from the terminal 103, reduced by the 0.1 V voltage drop across the output FET, to the output node 161 such that the −1.9 V potential appears at the output node 161.

In the second preferred embodiment of the present invention, the temperature induced change in $V_C$ across the diode 106 has less effect on the normal operations of the circuit 92 since the nominal voltage at the gate 104 of the output FET 102 is such that the current limiter FET 157 operates in region III shown in FIG. 5E to limit the forward bias of the parasitic diodes (shown in dashed lines in FIG. 4) of the FET 102.

The advantages of the current limiter circuit 105 may be appreciated by referring to the following results of calculations that simulate the operation of the circuit 92 both with and without the current limiter circuit 105. In particular for $V_{IH}$ above $-1.16$ V, at which the amplified signal 98 represents logic 1 and goes to approximately 0.0 V, the corresponding $V_O$ at the output 109 is $-1.9$ V with the current limiter circuit 105 connected and is $-1.93$ V with the current limiter circuit 105 shorted out. This corresponds to gate current to the gate 104 of the output FET 102 of 0.21 milliamps which will dissipate substantially less power than the gate current when the current limiter 105 is shorted out. This increased gate current without the current limiter is 0.45 milliamps. It may be appreciated that $V_{OL}$ without the current limiter is substantially less than $V_{OL}$ with the current limiter because of the voltage drop across the source resistor of the output FET 102 which prevents the $V_{OL}$ from falling to the full $-1.9$ V potential by the amount of the voltage drop across the source resistor of the output FET 102.

While the preferred embodiments have been described in order to illustrate the fundamental relationships of the present invention, it should be understood that numerous variations and modifications may be made to these embodiments without departing from the teachings and concepts of the present invention. Accordingly, it should be clearly understood that the form of the present invention described above and shown in the accompanying drawings is illustrative only and is not intended to limit the scope of the invention to less than that described in the following claims.

What is claimed is:

1. A logic circuit comprising:
   input circuit means including at least one input field effect transistor (FET) having a gate for receiving an input signal and having an output terminal coupled to an intermediate node, and first means for biasing said input FET so that in response to the input signal received by said input FET the voltage at said intermediate node nominally varies in response to that of the input signal, said first biasing means providing relatively constant bias current for said input FET;
   output circuit means including an output FET and second means for biasing said output FET to a high conduction or low conduction state selectively in accordance with the level of voltage applied to a gate of said output FET to produce an output signal having a nominal voltage swing, said voltage applied to said gate of said output FET tending to forward bias said output FET; and
   limiter means coupled between said gate of said output FET and said intermediate node for limiting the forward biasing of said output FET in response to the input signal to maintain the output voltage swing at the nominal value thereof.

2. A logic circuit as recited in claim 1, wherein:
   said limiter means is effective to limit the current to said gate of said output FET so that the voltage at said intermediate node varies in response to that of the input signal.

3. A logic circuit as recited in claim 1, wherein:
   said output FET has a parasitic gate-to-source diode; and
   said limiter means includes a FET having a drain coupled to said intermediate node and an interconnected gate and source coupled to said gate of said output FET, said limiter means being effective to limit the forward biasing of said diode.

4. A logic circuit as recited in claim 1, wherein:
   voltage level shift means are connected between said intermediate node and said limiter means for applying to said limiter means a voltage that is shifted from that applied to said intermediate node; and
   said limiter means is effective in response to the shifted voltage from said voltage level shift means to limit the current to said gate of said output FET to prevent said voltage level shift means and said output FET from becoming increasingly forward biased.

5. A logic current as recited in claim 1, wherein:
   voltage level shift means are connected between said intermediate node and said limiter means for applying to said limiter means a voltage that is shifted from that applied to said intermediate node, said voltage level shift means having a voltage drop characteristic that varies in response to the operating temperature of said logic circuit so that at various operating temperatures said voltage level shift means and said output FET tend to become increasingly forward biased; and
   said limiter means is effective in response to the shifted voltage from said voltage level shift means that tends to increasingly forward bias said output FET to limit the current to said gate of said output FET to prevent said voltage level shift means and said output FET from becoming increasingly forward biased.

6. A logic circuit for operation under a relatively wide range of operating conditions, comprising:
   input circuit means including at least one input FET responsive to an input signal for producing an intermediate signal in response to the input signal;
   means coupled to the input circuit for shifting the voltage level of the intermediate signal by a given amount, said voltage level shift means being responsive to variations in said operating temperature to vary the amount of said voltage level shift;
   output circuit means including an output FET coupled to said voltage level shift means for response to the level shifted intermediate signal, said output FET having at least one parasitic diode from the gate thereof, said output circuit means also including first means for biasing said output FET to opposite conduction states in response to the level shifted intermediate signal, said first biasing means being variable under operating conditions and tending to heavily forward bias said parasitic diode and said voltage level shift means;
   second means connected to said output FET and said shifting means for providing relatively constant bias current for said shifting means; and
   a limiter FET having a drain connected to said voltage level shift means and to said second means and having a gate connected to both its source and to said output FET, said limiter FET being effective when the operating temperature and said first biasing means vary to limit the current to said output FET and limit the forward biasing of said voltage level shift means and said parasitic diode of said output FET.

7. A logic circuit as recited in claim 6, wherein:

said voltage level shift means includes a level shift diode, said diode being effective to level shift the voltage of the intermediate signal by a reduced amount as the operating temperature increases so that the voltage level applied to said limiter FET is increased at increased temperature; and said limiter FET being responsive to the increased voltage level of the intermediate signal for limiting the voltage applied to said gate of said output FET to limit the forward biasing of said level shift diode and said parasitic diode of said output FET when said voltage of said intermediate signal increases at increased temperature.

8. A field effect transistor (FET) diode FET logic integrated circuit for operation under a relatively wide range of operating conditions comprising:

a semiconductor;

a first FET on said semiconductor and having a gate providing a logic input to the integrated circuit, a source connected to an intermediate logic output and a drain to be coupled to a voltage supply;

first means on said semiconductor for biasing said first FET so that in response to an input signal received by said logic input of said first FET the voltage of an intermediate signal at said intermediate logic output nominally varies in response to that of the input signal;

at least one Schottky barrier voltage level shift diode on said semiconductor connected to said intermediate logic output for voltage-level-shifting said intermediate signal, said voltage level shift diode being responsive to variations in said operating temperature to vary the amount of said voltage level shift, said shift diode tending to be increasingly forward biased as the operating temperature increases;

said first means including a second FET connected to said voltage level shift diode and having a gate thereof connected to a source thereof to provide zero voltage across said gate and said source of said second FET, said second FET providing relatively constant bias circuit for said voltage level shift diode;

a third FET on said semiconductor, the drain of said third FET providing a final logic output for said integrated circuit, the gate of said third FET being responsive to the voltage-shifted intermediate signal from said diode, said third FET having a parasitic gate-to-source diode and a parasitic gate-to-drain diode that tend to be increasingly forward biased in response to said intermediate signal;

second means for biasing said third FET to a high conduction or a low conduction state selectively in accordance with the level of voltage of the voltage-level-shifted intermediate signal appleid to said gate of said third FET to produce an output signal having a nominal voltage swing, said second biasing means being variable in response to operating conditions to tend to increase the forward bias of said shift diode and said parasitic diodes; and a fourth FET on said semiconductor having an interconnected gate and source connected to said gate of said third FET and a drain connected to said intermediate logic output through said Schottky barrier diode, said fourth FET being effective to limit the current to said gate of said third FET and limit the forward biasing of said shift diode and said parasitic diodes to minimize the variation of output voltage swing from its nominal value and reduce the power dissipated by said circuit.

* * * * *